United States Patent [19]

Takiar et al.

[11] Patent Number: 4,723,197
[45] Date of Patent: Feb. 2, 1988

[54] BONDING PAD INTERCONNECTION STRUCTURE

[75] Inventors: Hem P. Takiar, San Jose; Thomas George, Albany, both of Calif.

[73] Assignee: National Semiconductor Corporation, Santa Clara, Calif.

[21] Appl. No.: 809,448

[22] Filed: Dec. 16, 1985

[51] Int. Cl.⁴ .............................................. H05K 7/10
[52] U.S. Cl. ..................................... 361/403; 357/54; 357/71
[58] Field of Search ................. 361/402, 403; 357/24, 357/50, 54, 71, 72, 91

[56] References Cited

U.S. PATENT DOCUMENTS

| | | | |
|---|---|---|---|
| 4,063,992 | 12/1977 | Hosack | 357/24 X |
| 4,184,909 | 1/1980 | Chang et al. | 357/71 X |
| 4,330,790 | 5/1982 | Burns | 357/70 |
| 4,331,740 | 5/1982 | Burns | 428/572 |
| 4,355,463 | 10/1982 | Burns | 29/827 |
| 4,423,547 | 1/1984 | Farrar et al. | 357/54 X |
| 4,424,621 | 1/1984 | Abbas et al. | 357/50 X |
| 4,466,183 | 8/1984 | Burns | 29/827 |
| 4,470,507 | 9/1984 | Burns | 206/330 |
| 4,523,372 | 6/1985 | Balda et al. | 357/71 X |
| 4,585,490 | 4/1986 | Raffel et al. | 357/91 X |
| 4,587,719 | 5/1986 | Barth | 357/72 X |

Primary Examiner—J. R. Scott
Assistant Examiner—Derek S. Jennings
Attorney, Agent, or Firm—Gail W. Woodward

[57] ABSTRACT

Semiconductor devices having bonding pads formed over active regions on the device are fabricated by providing protective layers between the bonding pad and the underlying active region(s). The first protective layer is formed from a polyimide material which can absorb shock resulting from tape automated bonding of the bonding pad. The second protective layer is formed from a puncture-resistant material, such as a plasma nitride, which will prevent penetration of the bonding pad resulting from the downward force applied during tape automated bonding. The bonding pad is connected to active regions or metallization pads on the device substrate by a metal interconnect having a vertical run and a lateral run. The vertical run penetrates the protective layers as well as any passivation layers which may be present, while the lateral run provides an offset for the bonding pad. In this way, the bonding pad and the active region of the substrate will be separated by the protective layers.

9 Claims, 3 Drawing Figures

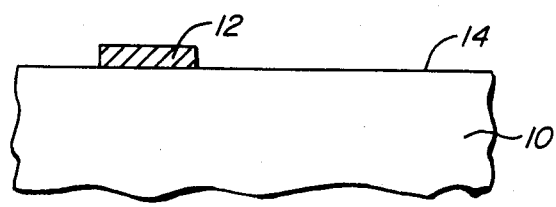
FIG._1.
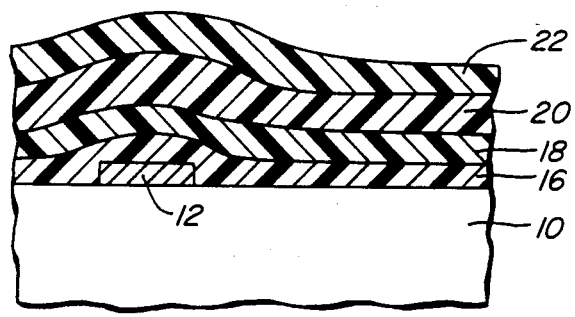
FIG._2.
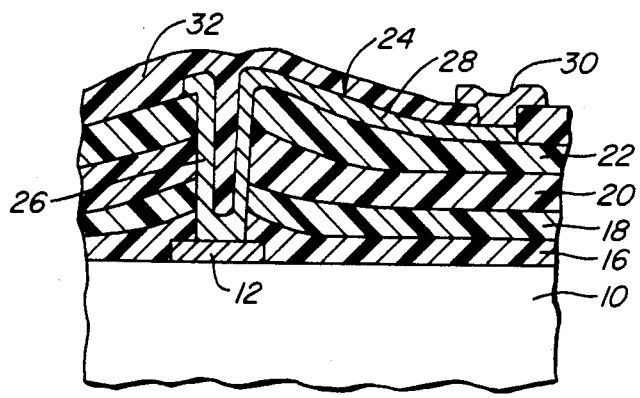
FIG._3.

BONDING PAD INTERCONNECTION STRUCTURE

BACKGROUND OF THE INVENTION

1. Field of the Invention

The present invention relates generally to semiconductor devices which may be packaged employing tape automated bonding techniques, and more particularly to a bonding pad interconnection structure which allows for placement of at least some bonding pads over active regions of the device.

Tape automated bonding is a method for simultaneously connecting a plurality of bonding pads on a semiconductor device to external circuitry. The method employs a continuous metal tape having individual frames defining metal leads which are arranged in a pattern so that the inner ends of the leads may be bonded to the bonding pads on the device while the outer ends of the leads may be joined to a conventional lead frame or left free to be otherwise connected to external circuitry.

Active circuit elements, including transistors, resistors, and the like, are generally located in the central portion of the semiconductor device, usually referred to as the active region(s). Heretofore, the bonding pads have normally been located around the periphery of the active region so that bonding of the tape leads is less likely to damage the active circuit elements. Such bonding is accomplished by thermocompression techniques, and the resulting heat and pressure would expose underlying circuit elements to potential damage.

In many instances, it would be desirable to be able to locate bonding pads over the active region of the semiconductor device. For example, in order to standardize the arrangement of bonding pads on a variety of different semiconductor devices, it will often be necessary to locate bonding pads over active regions on at least some of the devices. The ability to locate the bonding pads over the device active regions may also simplify design of the metallization layers since it would eliminate the need to connect all bonding pads to the periphery of the device. The elimination of peripheral bonding pads would also allow the construction of semiconductors with smaller die sizes.

For these reasons, it would be highly desirable to provide a bonding pad interconnection structure and method for producing such structure which allows the placement of bonding pads directly over the active regions of the device. In particular, it would be desirable to provide such a structure which will protect the underlying circuit elements in the active region from damage resulting from thermocompression bonding of tape leads in conventional tape automated bonding operations.

2. Description of the Background Art

Tape automated bonding is described in U.S. Pat. Nos. 4,330,790; 4,331,740; 4,355,463; 4,466,183; and 4,470,507.

SUMMARY OF THE INVENTION

The present invention provides an improved bonding pad interconnection structure for semiconductor devices which allows the placement of bonding pads directly over the active region(s) of the device. The bonding pad interconnection structure includes at least two protective layers over the active region and beneath the bonding pads so that the bonding pads may be subjected to the heat and pressure of tape automated bonding operations without harming underlying circuit elements in the active region.

The bonding pad structure is formed on the semiconductor device by first applying a polyimide layer over the device substrate. The polyimide layer is resilient and sufficiently thick to absorb shock induced by the tape automated bonding and to protect the underlying circuit elements. A puncture-resistant layer, typically silicon nitride or silicon oxynitride, is then applied over the polyimide layer. The puncture-resistant layer acts to inhibit downward penetration of the bonding pad during the tape bonding operation. The structure is completed by forming a metal interconnect between an underlying circuit element or metallization on the substrate and a bonding pad located on the surface of the puncture-resistant layer. The metal interconnect extends downward through both the puncture-resistant layer and the polyimide layer and laterally over the puncture-resistant layer to a location which is laterally offset from the downward leg. A bonding pad is formed at the termination of the metal interconnect. In this way, downward force on the bonding pad is not transmitted directly to the underlying substrate through the downward leg of the interconnect.

BRIEF DESCRIPTION OF THE DRAWINGS

FIG. 1 illustrates a semiconductor substrate having a metallization pad formed thereon prior to formation of the protective layers of the present invention.

FIG. 2 illustrates the substrate of FIG. 1 having polyimide and puncture-resistant layers of the present invention formed thereover.

FIG. 3 illustrates the bonding pad interconnection structure of the present invention in its final form.

DESCRIPTION OF THE PREFERRED EMBODIMENT

The present invention provides a novel bond pad interconnect structure formed over a semiconductor device substrate. The substrate will typically comprise a silicon wafer which has been processed by conventional techniques to produce a plurality of integrated circuits, typically referred to as chips or dies, thereon. Each integrated circuit will include a number of circuit elements and metallization pads which must be interconnected to metal bonding pads, which in turn are bonded to external circuitry. The present invention provides a novel interconnect structure extending from the metallization pad or circuit element on the substrate to the bonding pad, as will now be described in detail.

Referring to FIG. 1, a semiconductor substrate 10 includes a metallization pad 12 on its upper surface. As used hereinafter and in the claims, all designations of direction will be made in reference to the figures where the substrate is the lowermost portion of the semiconductor structure and the subsequent layers are arranged over the substrate. Surface 14 of the substrate defines the horizontal or lateral direction, while the direction which is perpendicular or normal to surface 14 will be considered the vertical direction.

Referring now to FIG. 2, a pair of passivation layers 16 and 18 are optionally formed over the substrate 10. The lower passivation layer 16 will typically be a silicon dioxide layer formed by either chemical vapor deposition or plasma deposition. The thickness of the layer will be between about 0.5 $\mu$m and 1.5 $\mu$m. The upper passivation layer 18 will typically be a silicon nitride layer having a thickness in the range from 0.5 μm to 1.5 μm. The silicon nitride layer may also be applied by chemical vapor deposition, or other conventional techniques. The use and application of such passivation layers are known in prior art and does not form part of the present invention. In some cases, the passivation layers 16 and 18 will be unnecessary, particularly when the overlying protective layers of the present invention provide sufficient insulation. In other cases, however, silicon dioxide and/or silicon nitride passivation layers will be required to provide the necessary dielectric separation between devices in the active region and overlying metallization lines, or for other reasons.

The first protective layer is polyimide layer 20. The term polyimide is intended to embrace both unmodified polyimides as well as modified polyimides, such as polyimide-isoindroquinazalinedione (PIQ). The polyimides are applied to a final thickness in the range from about 1.0 to 2.0 μm, usually about 1.5 μm, employing conventional techniques such as spin-on. After application, the polyimide will be heat-cured in a conventional manner.

A puncture-resistant layer 22 is applied directly on top of the polyimide layer 20. The puncture-resistant layer is preferably silicon nitride or silicon oxynitride applied by plasma deposition to a thickness in the range from about 5,000 to 10,000 Å, usually about 8,000 Å. Plasma deposition is preferred since it results in a particularly tough, puncture resistant material when compared to other deposition techniques, such as chemical vapor deposition. Once the puncture-resistant layer 22 has been formed, the structure will appear as illustrated in FIG. 2.

Referring now to FIG. 3, a metal interconnect 24 having a vertical leg 26 and a lateral leg 28 is formed to extend between metallization pad 12 on the substrate and a metal bonding pad 30. The metal interconnect 24 is formed by first etching a vertical access hole through the insulating and protective layers 16, 18, 20, and 22. Such access hole may be formed by conventional photolithographic and etching techniques. An aluminum layer is then formed over the puncture-resistant layer 22 by conventional techniques, and the aluminum layer patterned to form the lateral run 28 of the interconnect 24. The lateral run 28 extends away from the vertical run 26 so that the bonding pad 30 may be offset from said vertical run. If the bonding pad 30 were located directly over the vertical run 26, downward force resulting from the thermocompression used in tape automated bonding operations would be transmitted directly downward through the vertical metal column which forms the vertical run 26. By offsetting the bonding pad 30, the underlying substrate is protected from damage resulting from the thermocompression step by the intermediate protective layers 20 and 22. Specifically, polyimide layer 20 is resilient and acts to absorb shock resulting from the thermocompression, while the plasma nitride layer 22 resists penetration of the overlying bonding pad 30 and metallization. With this structure, it has been found possible to locate bonding pads directly above the active regions of semiconductor devices while greatly reducing the likelihood that the circuit elements in the active regions might be damaged by tape automated bonding operations.

After the metal interconnect 24 has been formed, the structure will be covered by a final passivation layer 32. Layer 32 may comprise any conventional passivation material, typically being either a polyimide or silicon nitride layer. The final passivation layer 32 is then patterned by conventional photolithographic and etching techniques to produce an access hole above the termination of interconnect 28. The bonding pad 30, which is typically a copper structure, may then be formed by conventional techniques.

As illustrated in FIG. 3, the bonding pad 30 is suitable for tape automated bonding to metal bump tape. If it is desired to connect the bonding pad 30 to flat tape, it will be necessary to build a metal bump (not illustrated) on top of bonding pad 30. Such bumped bonding pad structures are well known in the prior art and need not be described in detail herein.

Although the foregoing invention has been described in some detail by way of illustration and example for purposes of clarity of understanding, it will be obvious that certain changes and modifications may be practiced within the scope of the appended claims.

What is claimed is:

1. A semiconductor device comprising:
   a substrate having a surface upon which is located at least one metallization pad;
   a polyimide layer formed over said surface and said metallization pad;
   a puncture-resistant layer formed over said polyimide layer
   a metal interconnect vertically penetrating both the polyimide layer and the puncture-resistant layer to connect with said metallization pad, said interconnect extending laterally over the puncture-resistant layer and terminating at a location offset from said metallization pad.

2. A semiconductor device as in claim 1, wherein at least one passivation layer is formed over the substrate and beneath the polyimide layer.

3. A semiconductor device as in claim 2 wherein said one passivation layer is composed of two individual component layers comprising a first silicon dioxide passivation layer and a second silicon nitride passivation layer formed over the substrate and beneath the polyimide layer.

4. A semiconductor device as in claim 1, wherein the polyimide layer is formed from polyimide-isoindroquinazalinedione (PIQ).

5. A semiconductor device as in claim 1, wherein the polyimide layer has a thickness in the range from about 1.0 to 2.0 μm.

6. A semiconductor device as in claim 1, wherein the puncture resistant layer is formed from silicon nitride or silicon oxynitride.

7. A semiconductor device as in claim 1, further comprising a passivation layer formed over the puncture-resistant layer.

8. A semiconductor device as in claim 7, further comprising a metal bonding pad structure formed at the termination of the metal interconnect and penetrating the passivation layer.

9. A semiconductor device as in claim 8, wherein the passivation layer is formed from silicon nitride or polyimide.

* * * * *